(12) United States Patent
Lin et al.

(10) Patent No.: US 10,297,588 B2
(45) Date of Patent: May 21, 2019

(54) SEMICONDUCTOR DEVICE AND FABRICATION METHOD OF THE SAME

(71) Applicant: TAIWAN SEMICONDUCTOR MANUFACTURING CO., LTD., Hsinchu (TW)

(72) Inventors: Wei-Cheng Lin, Taichung (TW); Hui-Ting Yang, Hsinchu County (TW); Shih-Wei Peng, Hsinchu (TW); Jiann-Tyng Tzeng, Hsinchu (TW); Charles Chew-Yuen Young, Cupertino, CA (US); Chih-Ming Lai, Hsinchu (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

(21) Appl. No.: 15/699,990

(22) Filed: Sep. 8, 2017

(65) Prior Publication Data
US 2018/0166431 A1 Jun. 14, 2018

Related U.S. Application Data

(60) Provisional application No. 62/434,362, filed on Dec. 14, 2016.

(51) Int. Cl.
*H01L 27/02* (2006.01)
*H01L 23/485* (2006.01)
(Continued)

(52) U.S. Cl.
CPC .. *H01L 27/0207* (2013.01); *H01L 21/823431* (2013.01); *H01L 21/823437* (2013.01); *H01L 21/823475* (2013.01); *H01L 23/485* (2013.01); *H01L 27/088* (2013.01); *H01L 27/0886* (2013.01); *H01L 23/5226* (2013.01); *H01L 23/5286* (2013.01)

(58) Field of Classification Search
CPC ............... H01L 27/0207; H01L 23/485; H01L 21/823437; H01L 27/088; H01L 21/823431; H01L 21/823475; H01L 27/0886; H01L 23/5286; H01L 23/5226
See application file for complete search history.

(56) References Cited

U.S. PATENT DOCUMENTS 9,368,443 B1 * 6/2016 Tao ..................... H01L 27/0207
9,515,077 B1 * 12/2016 Liaw .................. H01L 27/1104
(Continued)

OTHER PUBLICATIONS

U.S. Appl. No. 15/457,640, filed Mar. 13, 2017.

*Primary Examiner* — Victor A Mandala
(74) *Attorney, Agent, or Firm* — Maschoff Brennan

(57) ABSTRACT

A semiconductor device includes at least one first gate strip, at least one second gate strip, at least one first conductive line and at least one first conductive via. An end surface of the at least one first gate strip and an end surface of the at least one second gate strip are opposite each other. The at least one first conductive line is over the at least one first gate strip and the at least one second gate strip and across the end surface of the at least one first gate strip and the end surface of the at least one second gate strip. The at least one first conductive via connects the at least one first conductive line and the at least one first gate strip.

20 Claims, 11 Drawing Sheets

(51) Int. Cl.
  *H01L 27/088* (2006.01)
  *H01L 21/8234* (2006.01)
  *H01L 23/522* (2006.01)
  *H01L 23/528* (2006.01)

(56) References Cited

U.S. PATENT DOCUMENTS

2015/0302917 A1\* 10/2015 Grover .................. G11C 11/412
                                                                365/51
2017/0207227 A1\*  7/2017 Chen ..................... G11C 11/412
2017/0358565 A1\* 12/2017 Hensel ................ H01L 27/0207
2018/0145063 A1\*  5/2018 Nelson ................ H01L 27/0207
2018/0204795 A1\*  7/2018 Smayling .............. H01L 21/027

\* cited by examiner

SEMICONDUCTOR DEVICE AND FABRICATION METHOD OF THE SAME

RELATED APPLICATIONS

This application claims priority to U.S. Provisional Application Ser. No. 62/434,362, filed Dec. 14, 2016, which is herein incorporated by reference.

BACKGROUND

For integrated circuit layouts, there are size limitations such as minimum pitch or spacing. In some layouts, a conductive line such as a polysilicon line is cut with a cut pattern. However, some layout methods have a photolithography process limit as the integrated circuit size shrinks.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
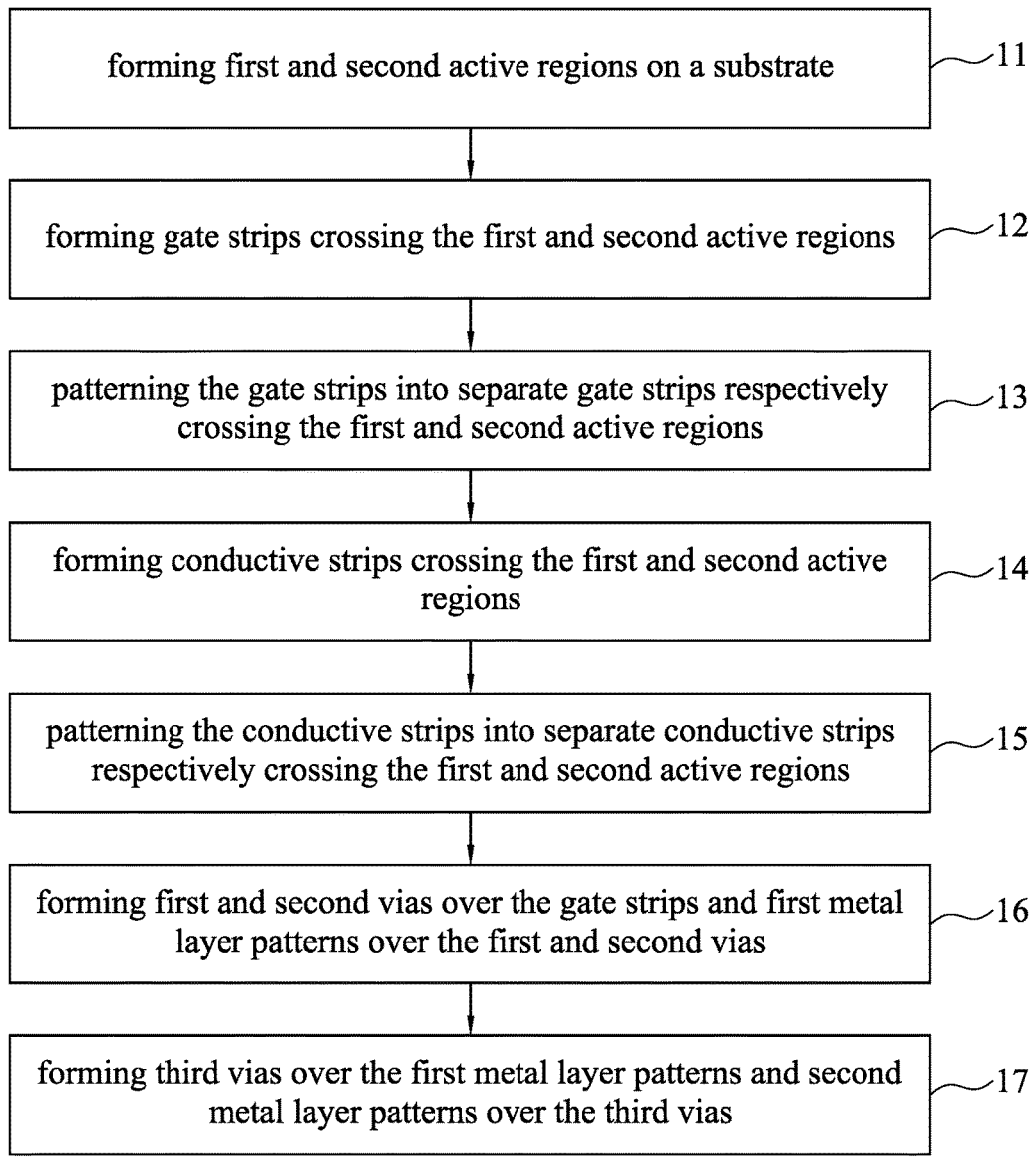
FIG. 1 depicts a flow chart of a method of fabricating a semiconductor device in accordance with some embodiments of the instant disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

It will be understood that, although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

As used herein, the terms "comprising," "including," "having," "containing," "involving," and the like are to be understood to be open-ended, i.e., to mean including but not limited to.

Reference throughout the specification to "one embodiment" or "an embodiment" means that a particular feature, structure, implementation, or characteristic described in connection with the embodiment is included in at least one embodiment of the present disclosure. Thus, uses of the phrases "in one embodiment" or "in an embodiment" in various places throughout the specification are not necessarily all referring to the same embodiment. Furthermore, the particular features, structures, implementation, or characteristics may be combined in any suitable manner in one or more embodiments.

Figure 2:
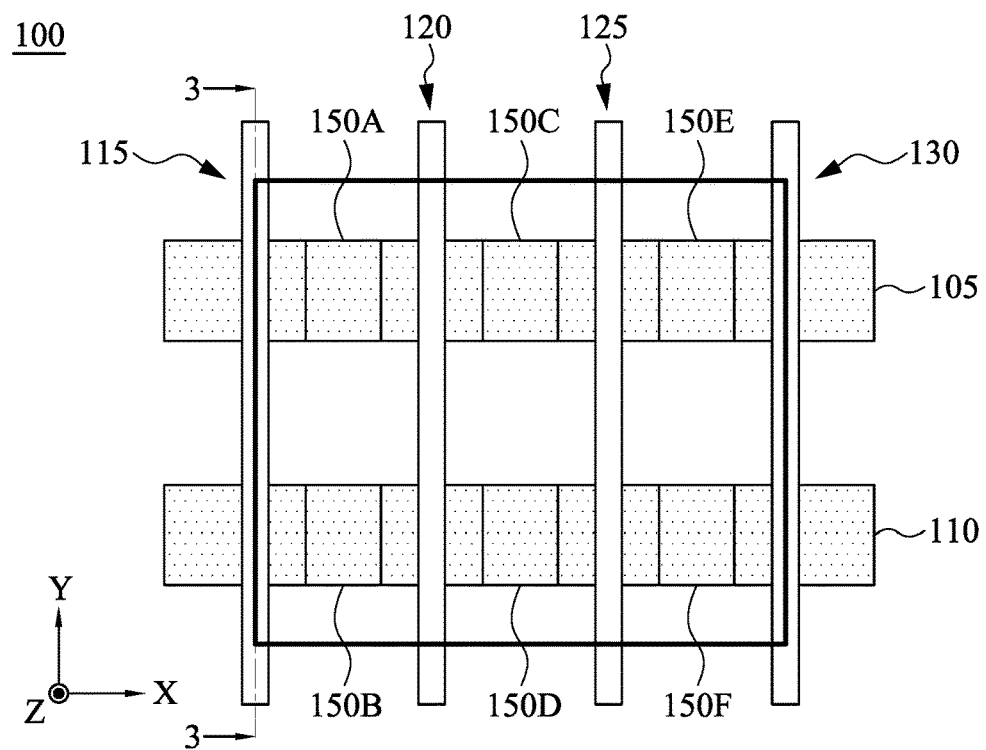
FIG. 2 is a schematic plan view of a cell of a semiconductor device at an intermediate stage during fabrication in accordance with various embodiments of the present disclosure.
Figure 3:
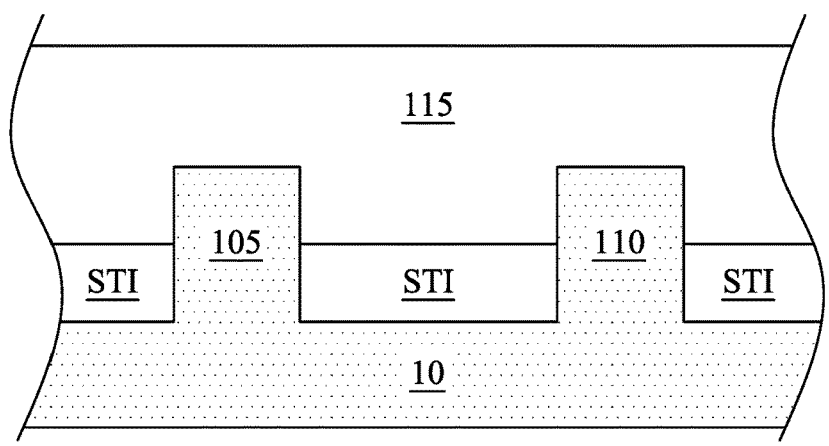
FIG. 3 is a cross sectional view taken along line 3-3 in FIG. 2.
Figure 4:
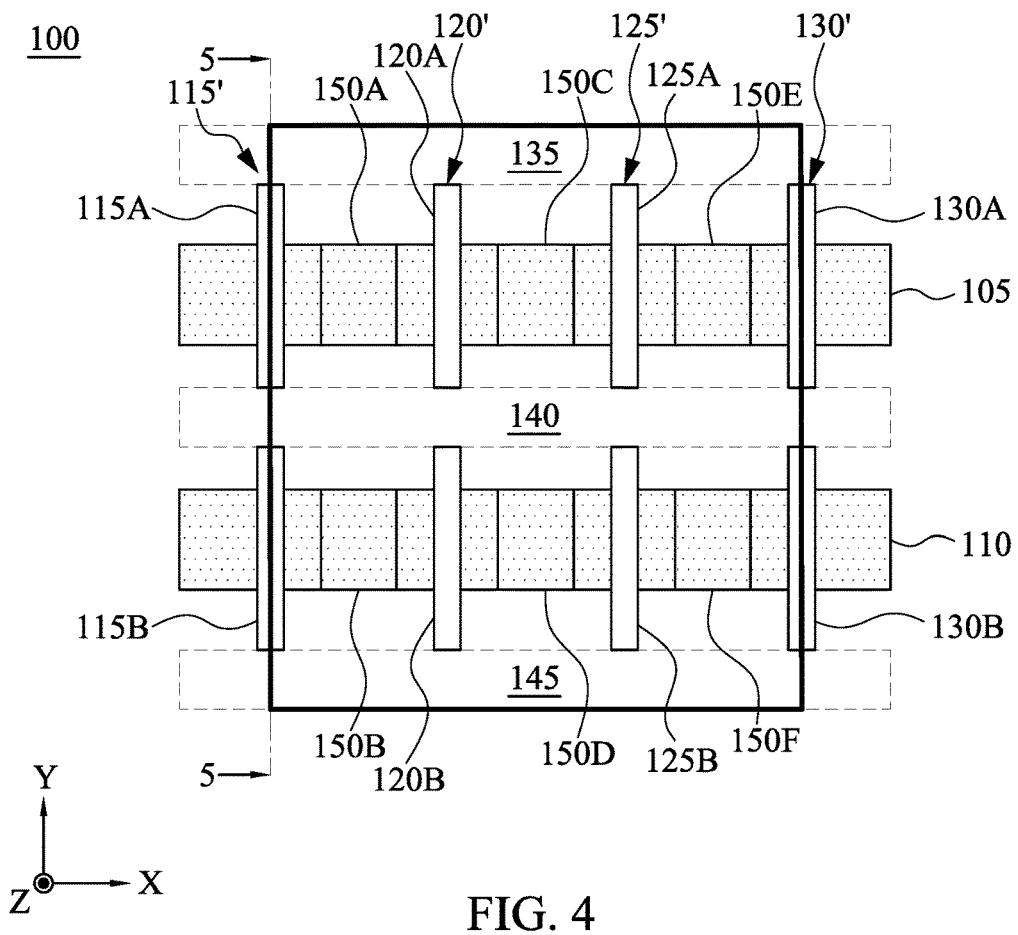
FIG. 4 is a schematic plan view of a cell of a semiconductor device at an intermediate stage during fabrication in accordance with various embodiments of the present disclosure.
Figure 5:
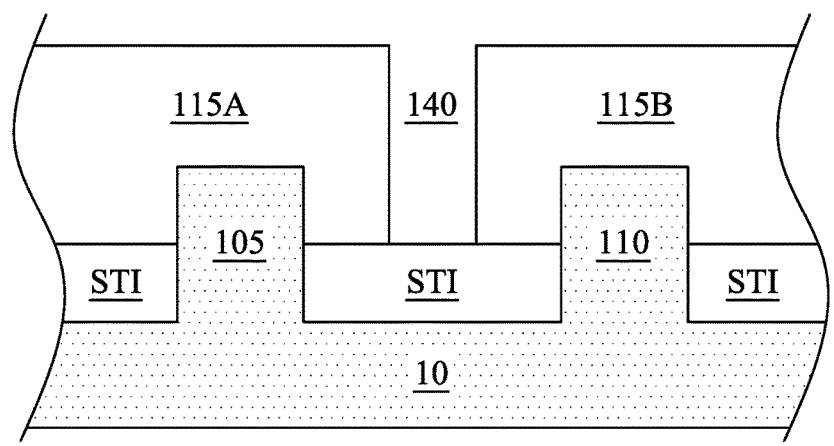
FIG. 5 is a cross sectional view taken along line 5-5 in FIG. 4.
Figure 6:
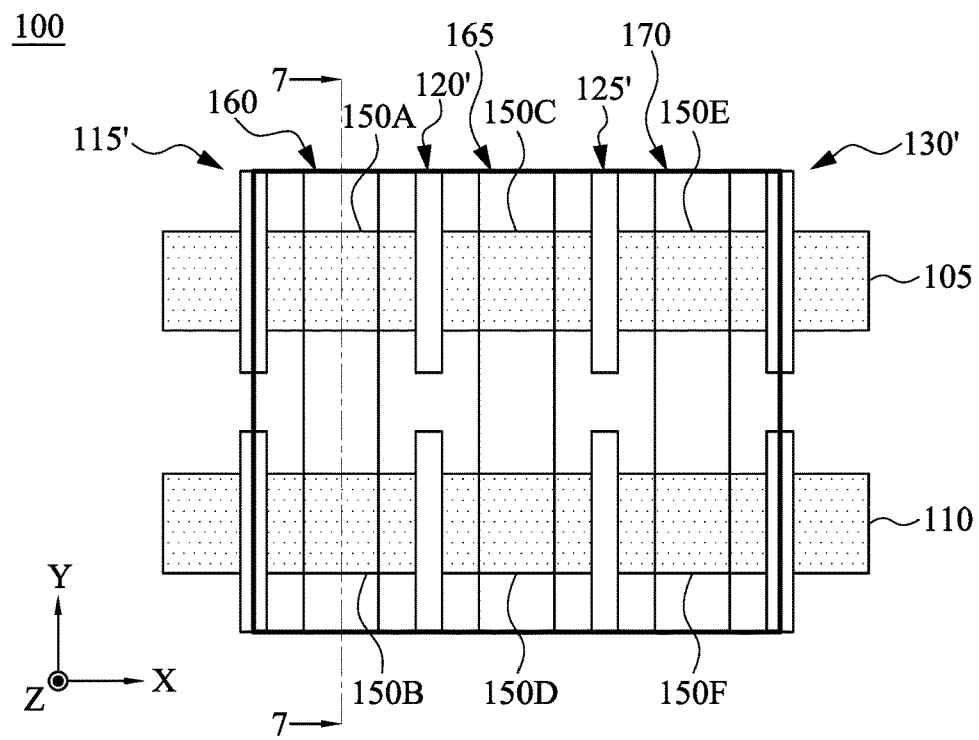
FIG. 6 is a schematic plan view of a cell of a semiconductor device at an intermediate stage during fabrication in accordance with various embodiments of the present disclosure.
Figure 7:
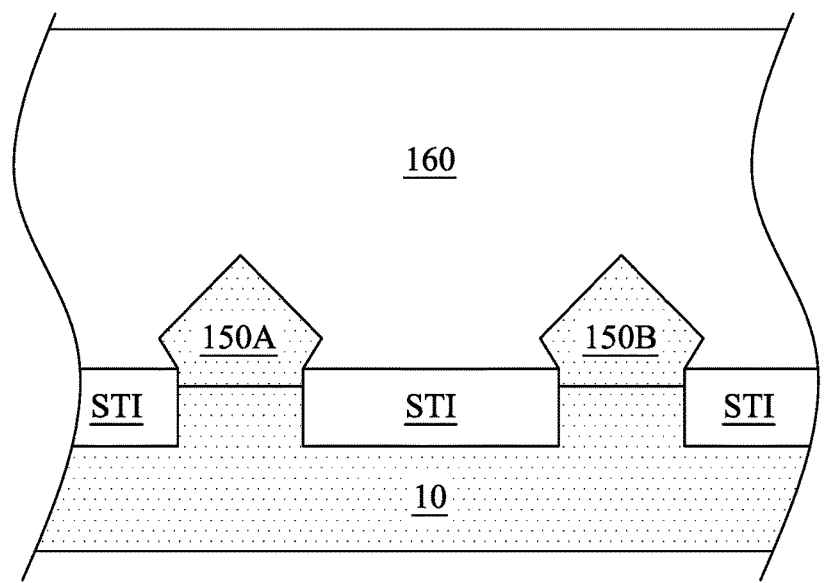
FIG. 7 is a cross sectional view taken along line 7-7 in FIG. 6.
Figure 8:
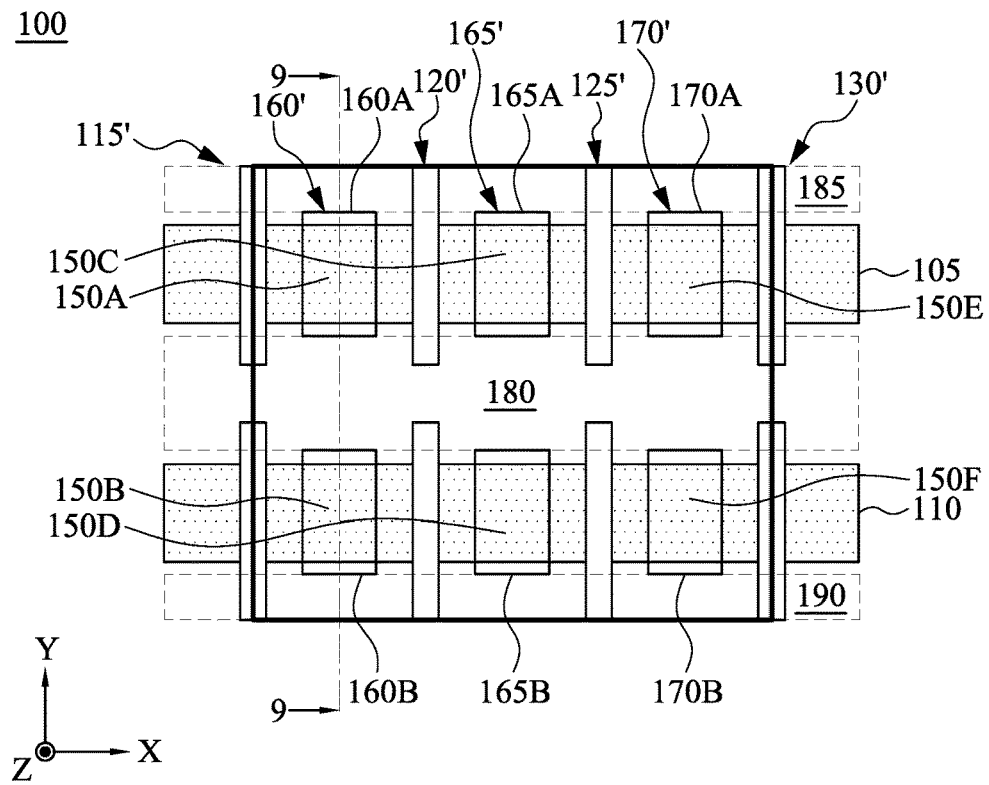
FIG. 8 is a schematic plan view of a cell of a semiconductor device at an intermediate stage during fabrication in accordance with various embodiments of the present disclosure.
Figure 9:
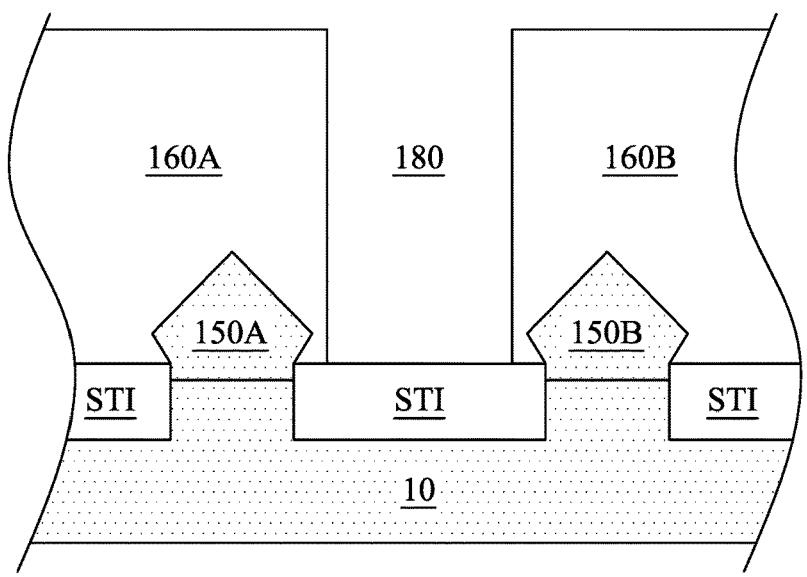
FIG. 9 is a cross sectional view taken along line 9-9 in FIG. 8.
Figure 10:
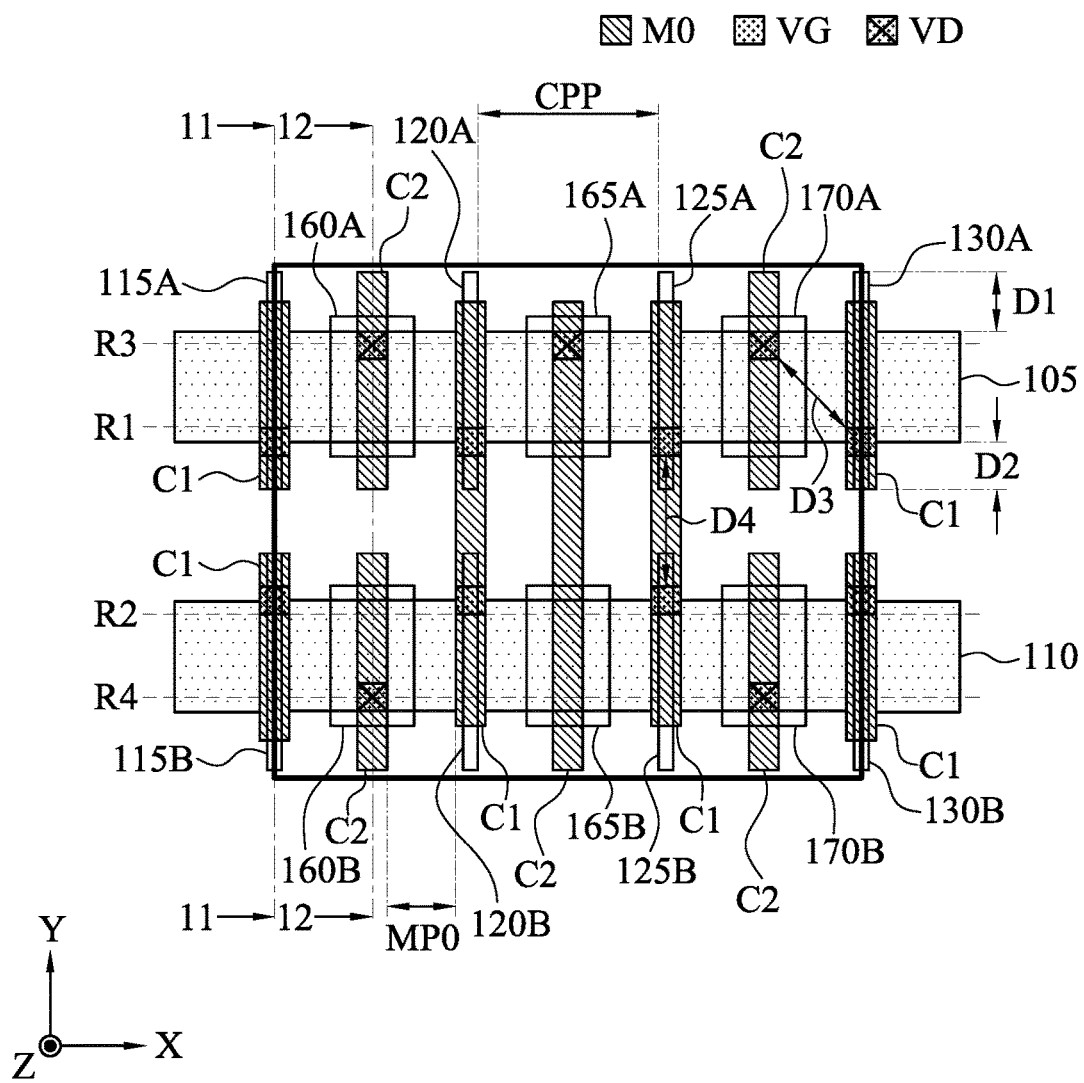
FIG. 10 is a schematic plan view of a cell of a semiconductor device at an intermediate stage during fabrication in accordance with various embodiments of the present disclosure.
Figure 11:
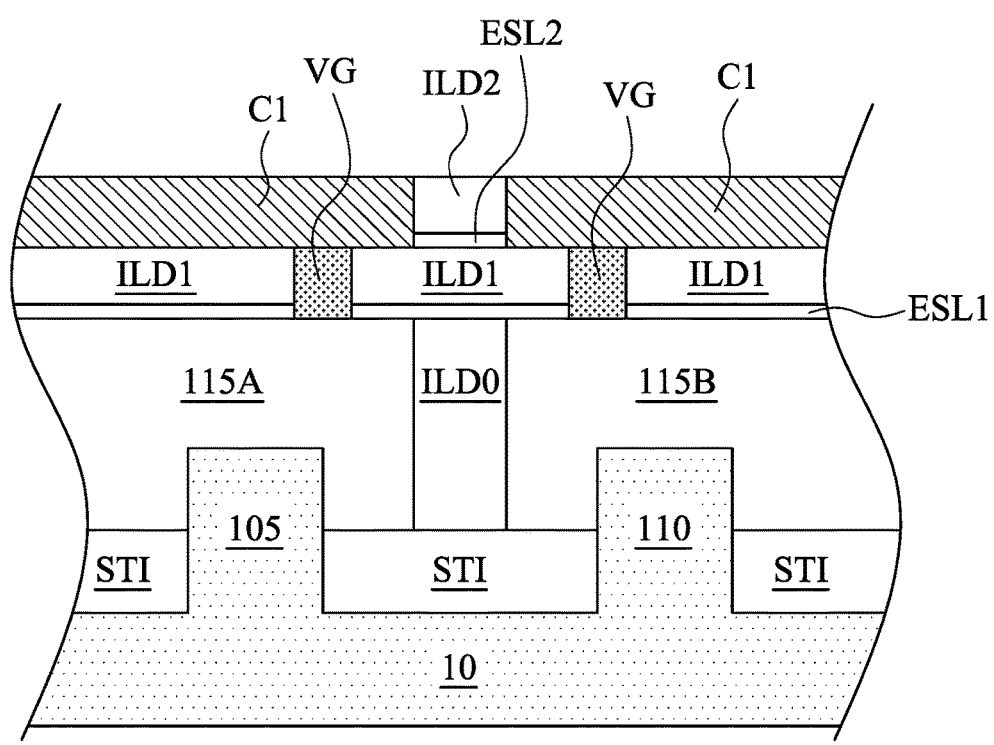
FIG. 11 is a cross sectional view taken along line 11-11 in FIG. 10.
Figure 12:
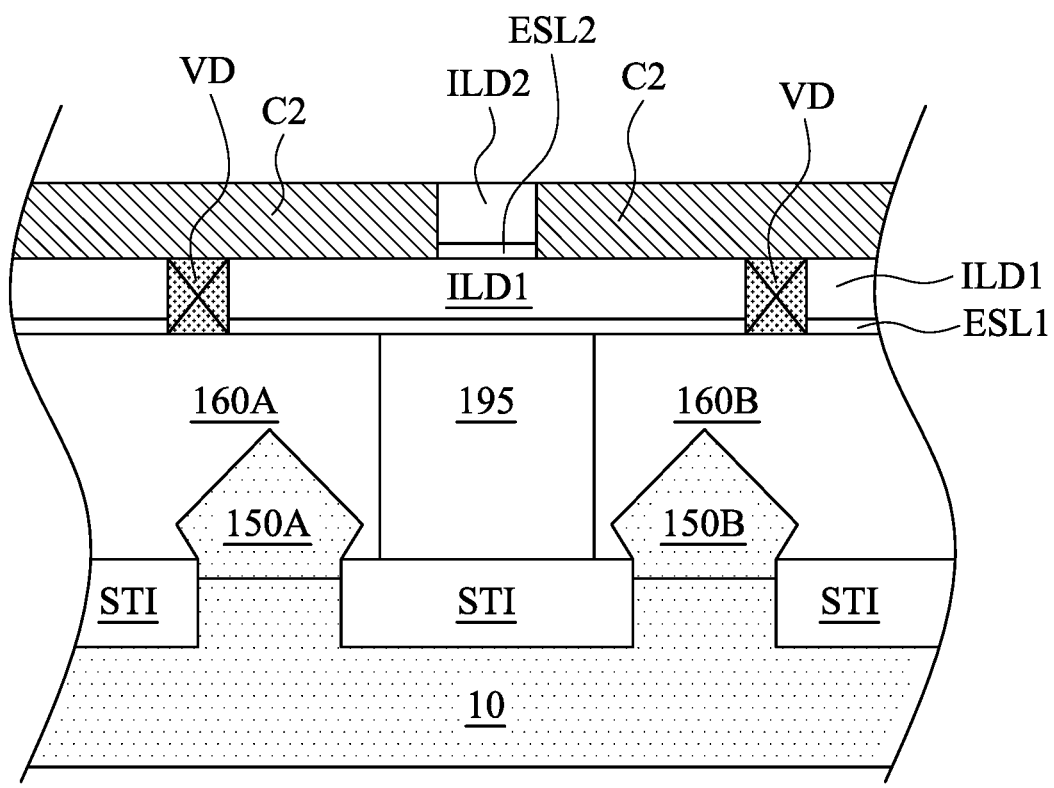
FIG. 12 is a cross sectional view taken along line 12-12 in FIG. 10.
Figure 14:
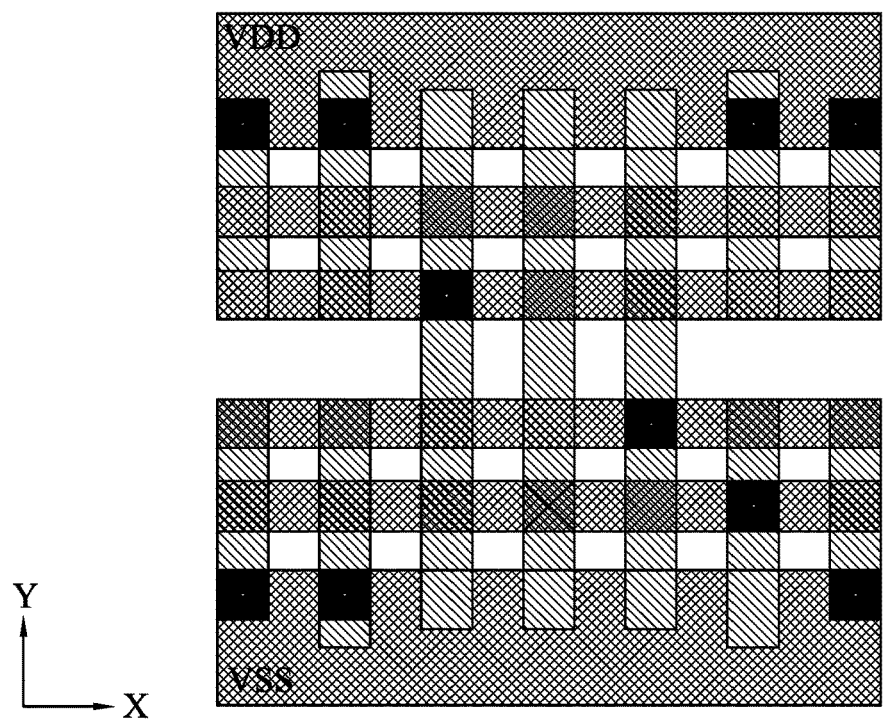
FIG. 14 is an exemplary plan view of a cell at an intermediate stage during fabrication in accordance with some embodiments of the present disclosure.

FIG. 1 depicts a flow chart of a method of fabricating a semiconductor device in accordance with some embodiments of the instant disclosure. The method is illustrated as including several enumerated steps. Various embodiments of the method may include additional steps before, after, in between, and/or as part of the enumerated steps. The method begins with operation 11 in which first and second active regions are formed on a substrate (as shown in FIGS. 2 and 3). The method continues with operation 12 in which a plurality of gate strips are formed crossing the first and second active regions (as shown in FIGS. 2 and 3). The method continues with operation 13 in which the gate strips are patterned into separate gate strips respectively crossing the first and second active regions (as shown in FIGS. 4 and 5). The method continues with operation 14 in which a plurality of conductive strips are formed crossing the first and second active regions (as shown in FIGS. 6 and 7). The method continues with operation 15 in which the conductive strips are patterned into separate conductive strips respectively crossing the first and second active regions (as shown in FIGS. 8 and 9). The method continues with operation 16 in which first and second conductive vias are formed over the gate strips and the conductive strips and first metal layer patterns are formed over the first and second conductive vias (as shown in FIGS. 10, 11 and 12). The method continues with operation 17 in which third conductive vias are formed over the first metal layer patterns and second metal layer patterns are formed over the third conductive vias (as shown in FIG. 14).

FIG. 2 is a schematic plan view of a cell 100 of a semiconductor device at an intermediate stage during fabrication in accordance with various embodiments of the present disclosure. FIG. 3 is a cross sectional view taken along line 3-3 in FIG. 2. A portion of the cell 100, which has a device region (e.g., logic function), is provided. The term device region as used herein refers to a region of the substrate associated with a metal oxide semiconductor (MOS) device having a particular type of channel. The channel type, n-type or p-type, of a channel is identified based on the conductivity type of the channel developed under the transverse electric field. This means that an NMOS device region, for example, includes an n-type channel under a transverse electric field and is associated with n-type doped source/drain regions and gate electrodes. Four boundaries of the cell 100 are marked using solid lines. Within the four boundaries, the cell 100 includes a substrate 10 having active regions 105 and 110 where devices such as transistors are formed. The active regions 105 and 110 may include a semiconductor material such as silicon, silicon germanium or the like. A shallow trench isolation (STI) region is located between the active regions 105 and 110 for electrical isolation and may comprise silicon oxide or any other suitable dielectric material.

Gate strips 115, 120, 125 and 130 are formed in the cell 100. The gate strips 115, 120, 125 and 130 are spaced apart and extend along a first direction. In some embodiments, the first direction is Y direction as illustrated in FIG. 2. The gate strips 115, 120, 125 and 130 can comprise polysilicon or other electrically conductive material such as metal. These gate strips 115, 120, 125 and 130 can be formed to cross the active regions 105 and 110 using suitable deposition and patterning techniques. For example, a layer of polysilicon can be deposited over the active regions 105 and 110, and the layer of polysilicon is pattered into the gate strips 115, 120, 125 and 130 using lithography and etching operations.

In some embodiments, the gate strips 115 and 130 are dummy gate strips and are respectively disposed at opposite boundaries of the cell 100. More specifically, the gate strips 115 and 130 are not used to form any circuit device. For illustration, the gate strips 115 and 130 are disposed at a left side boundary and a right side boundary of the cell 100 respectively.

After formation of the gate strips 115, 120, 125 and 130, source/drain regions 150A, 150C and 150E are formed on portions of the active region 105 not covered by the gate strips 115, 120, 125 and 130, and source/drain regions 150B, 150D and 150F are formed on portions of the active region 110 not covered by the gate strips 115, 120, 125 and 130. In some embodiments, the source/drain regions can be formed using one or more epitaxy processes, and the source/drain regions can be in-situ doped with an n-type impurity or a p-type impurity during the epitaxy growth. In some embodiments, the source/drain regions can be formed using one or more implantation processes so that an n-type impurity or a p-type impurity is doped into the source/drain regions.

Next, as shown in FIGS. 4 and 5, the gate strips 115, 120, 125 and 130 are patterned into separate gate strips 115', 120', 125' and 130' using lithography and etching operations. The separate gate strips 115' include gate strips 115A and 115B respectively over the active regions 105 and 110 and separated from each other. The separate gate strips 120' include gate strips 120A and 120B respectively over the active regions 105 and 110 and separated from each other. The separate gate strips 125' include gate strips 125A and 125B respectively over the active regions 105 and 110 and separated from each other. The separate gate strips 130' include gate strips 130A and 130B respectively over the active regions 105 and 110 and separated from each other. A cut section 140 is between the gate strips 115A and 115B, between the gate strips 120A and 120B, between the gate strips 125A and 120B, and between the gate strips 130A and 130B. The cut section 140 is fabricated from a cut line drawn in a layout. For example, the gate strips 115, 120, 125 and 130 are patterned using an etch pattern that is formed by a cut line pattern intersecting the gate strips 115, 120, 125 and 130, so that portions of the gate strips 115, 120, 125 and 130 can be removed during the etching operation.

If the cut line drawn in the layout is short (e.g. intersecting a single gate strip), the cut section 140 fabricated from the short cut line would be formed as a rounding pattern, such as an elliptical pattern or a circular pattern, due to the nature of lithography. Such a rounding pattern would result in unwanted curving end surfaces of the separate gate strips. Therefore, in some embodiments, a long cut line is drawn in the layout (e.g. intersecting more than one hundred gate strips), such that the cut section 140 may be free from the rounding pattern. As a result, end surfaces of the gate strips 115A, 120A, 125A and 130A respectively facing the gate strips 115B, 120B, 125B and 130B may be aligned in a substantially straight line (e.g. a line extending in the X direction), and the end surfaces of the gate strips 115B, 120B, 125B and 130B respectively facing the gate strips 115A, 120A, 125A and 130A may be aligned in a substantially straight line (e.g. a line extending in the X direction) as well. Therefore, the unwanted curving end surfaces of gate strips can be prevented.

In some embodiments, as illustratively shown in FIG. 4, the cut sections 135 and 145 are respectively formed on boundaries of the cell 100 that are opposite to each other, and the cut sections 135 and 145 extend in a second direction. The second direction is a lengthwise direction of the active regions 105 and 110 that is substantially perpendicular to the first direction. In some embodiments, the second direction is X direction as illustrated in FIG. 4. For illustration, the cut sections 135 and 145 are disposed at an upper side boundary and a lower side boundary of the cell 100 respectively. In some embodiments, the cut sections 135 and 145 are fabricated from long cut lines (e.g. intersecting more than one hundred gate strips) drawn in the layout, so that the cut sections 135 and 145 may be free from rounding patterns in some embodiments. As a result, end surfaces of the gate strips 115A, 120A, 125A and 130A that are close to the upper side boundary of the cell 100 may be aligned in a substantially straight line (e.g. a line extending in the X direction). Similarly, end surfaces of the gate strips 115B, 120B, 125B and 130B that are close to the lower side boundary of the cell 100 may be aligned in a substantially straight line (e.g. a line extending in the X direction).

FIG. 6 is a schematic plan view of the cell 100 at an intermediate stage during fabrication in accordance with some embodiments of the present disclosure. FIG. 7 is a cross sectional view taken along line 7-7 in FIG. 6. As illustrated in FIGS. 6 and 7, conductive strips 160, 165, and 170 are formed in the cell 100. The conductive strips 160, 165 and 170 are spaced apart and extend along the Y direction. The conductive strips 160, 165 and 170 can comprise tungsten, aluminum, copper, or other suitable metal. The conductive strip 160 intersects the active regions 105 and 110 and is in contact with the source/drain regions 150A and 150B. The conductive strip 165 intersects the active regions 105 and 110 and is in contact with the source/drain regions 150C and 150D. The conductive strip 170 intersects the active regions 105 and 110 and is in contact with the source/drain regions 150E and 150F. The conductive strips 160, 165 and 170 can be formed using suitable deposition and patterning techniques. For example, formation of the conductive strips 160, 165, and 170 may include forming an interlayer dielectric (ILD) layer (not shown) among the gate strips, etching trenches in the ILD layer, forming a metal into the trenches, and planarizing the metal with a top surface of the ILD using chemical mechanical polishing (CMP).

Next, as shown in FIGS. 8 and 9, the conductive strips 160, 165 and 170 are patterned into separate conductive strips 160', 165', and 170' using lithography and etching operations. The separate conductive strips 160' include conductive strips 160A and 160B respectively over the source/drain regions 150A and 150B and separated from each other. The separate conductive strips 165' include conductive strips 165A and 165B respectively over the source/drain regions 150C and 150D and separated from each other. The separate conductive strips 170' include conductive strips 170A and 170B respectively over the source/drain regions 150E and 150F and separated from each other. A cut section 180 is between the conductive strips 160A and 160B, between the conductive strips 165A and 165B, and between the conductive strips 170A and 170B. The cut section 180 is fabricated from a cut line drawn in a layout. For example, the conductive strips 160, 165 and 170 are patterned using an etch pattern that is formed by a cut line pattern intersecting the conductive strips 160, 165 and 170, so that portions of the conductive strips 160, 165 and 170 can be removed during the etching operation.

If the cut line drawn in the layout is short (e.g. intersecting a single conductive strip), the cut section 180 fabricated from the short cut line would be formed as a rounding pattern, such as an elliptical pattern or a circular pattern, due to the nature of lithography. Such a rounding pattern would result in unwanted curving end surfaces of the separate conductive strips. Therefore, in some embodiments, a long cut line (e.g. intersecting more than one hundred conductive strips) is drawn in the layout, such that the cut section 180 may be free from the rounding pattern. As a result, end surfaces of the conductive strips 160A, 165A and 170A respectively facing the conductive strips 160B, 165B and 170B may be aligned in a substantially straight line (e.g. a line extending in X direction), and the end surfaces of the conductive strips 160B, 165B and 170B respectively facing the conductive strips 160A, 165A and 170A may be aligned in a substantially straight line (e.g. a line extending in X direction) as well. Therefore, the unwanted curving end surfaces of conductive strips can be prevented.

In some embodiments, as illustratively shown in FIG. 8, the cut sections 185 and 190 are respectively formed on boundaries of the cell 100 that are opposite to each other and extend along the X direction. For illustration, the cut sections 185 and 190 are disposed at an upper side boundary and a lower side boundary of the cell 100 respectively. In some embodiments, the cut sections 185 and 190 are fabricated from long cut lines (e.g. intersecting more than one hundred conductive strips) drawn in the layout, so that the cut sections 185 and 190 may be free from rounding patterns in some embodiments. As a result, end surfaces of the conductive strips 160A, 165A, and 170A that are close to the upper side boundary of the cell 100 may be aligned in a substantially straight line (e.g. a line extending in the X direction). Similarly, end surfaces of the conductive strips 160B, 165B, and 170B that are close to the lower side boundary of the cell 100 may be aligned in a substantially straight line (e.g. a line extending in the X direction).

FIG. 10 is a schematic plan view of the cell 100 at an intermediate stage during fabrication in accordance with some embodiments of the present disclosure. As shown in FIG. 10, conductive vias VG and VD and first metal layer patterns M0 are formed in the cell 100. The first conductive vias VG are illustrated as grey patterns. As illustratively shown in FIG. 10, the first conductive vias VG are formed on the gate strips 115A, 115B, 120A, 120B, 125A, 125B, 130A and 130B respectively.

The first conductive vias VG allow electrical connection between the gate strips 115A, 115B, 120A, 120B, 125A, 125B, 130A and the first metal layer patterns M0. Various conductive materials used to form the first conductive vias VG are within the contemplated scope of the present disclosure.

The second conductive vias VD are illustrated as grey patterns each with a cross. As illustratively shown in FIG. 10, the second conductive vias VD are formed on the conductive strips 160A, 160B, 165A, 170A and 170B respectively.

The second conductive vias VD allow electrical connection between the conductive strips 160A, 160B, 165A, 170A and 170B and the first metal layer patterns M0. Various conductive materials used to form the second conductive vias VD are within the contemplated scope of the present disclosure.

The first metal layer patterns M0 are illustrated as patterns filled with slashes, in which the first metal layer patterns M0 are formed along the first direction, i.e. Y direction. For example, the first metal layer patterns M0 include first conductive lines C1 respectively superimposed over the gate strips 115A, 115B, 120A, 120B, 125A, 125B, 130A and 130B. The first conductive lines C1 extend along the Y direction, and hence lengthwise directions of the gate strips 115A, 115B, 120A, 120B, 125A, 125B, 130A and 130B are substantially parallel to lengthwise directions of the first conductive lines C1. The orientations of the gate strips 115A, 115B, 120A, 120B, 125A, 125B, 130A, and 130B and the first conductive lines C1 are substantially the same, and the gate strips 115A, 115B, 120A, 120B, 125A, 125B, 130A, and 130B are underlying the first conductive lines C1. This arrangement allows large overlapping area between the gate strips 115A, 115B, 120A, 120B, 125A, 125B, 130A, and 130B and the first conductive lines C1. The first conductive vias VG that serve to electrically connect the gate strips 115A, 115B, 120A, 120B, 125A, 125B, 130A and 130B and the first conductive lines C1 are able to be positioned along this overlapping area for electrical connection. For example, the first conductive line C1 is disposed over the gate strip 115A, and the first conductive via VG may be disposed on any place, along the Y-direction, where the gate strip 115A and the first conductive line C1 overlap one another. The positions of the first conductive vias VG can be relatively arbitrary because the gate strips 115A, 115B, 120A, 120B, 125A, 125B, 130A, and 130B and the first conductive lines C1 are aligned along the same direction (e.g., Y direction). Explained in a different way, the first conductive vias VG have the entire first conductive lines C1 as the connection node.

Since the Y direction positions of the first conductive vias VG are flexible, the first conductive vias VG can be formed in positions not over the cut section 140 as shown in FIG. 4, and hence the cut section 140 can be formed as a long cut section (e.g. intersecting more than one hundred gate strips) without considering positions of the first conductive vias VG. In other words, the substantially parallel arrangement of the first conductive lines C1 and the gate strips 115A, 115B, 120A, 120B, 125A, 125B, 130A and 130B is beneficial in forming a long cut section, such that unwanted curving end surfaces of the gate strips 115A, 115B, 120A, 120B, 125A, 125B, 130A and 130B can be prevented.

In some embodiments, the first conductive lines C1 are formed over the first conductive vias VG. The first conductive lines C1 are respectively coupled to the gate strips 115A, 115B, 120A, 120B, 125A, 125B, 130A and 130B through the corresponding first conductive vias VG.

One first conductive line C1 is across end surfaces of the gate strips 120A and 120B that are opposite each other. The first conductive line C1 is electrically coupled to the gate strips 120A and 120B through respective first conductive vias VG. One first conductive line C1 is across end surfaces of the gate strips 125A and 125B that are opposite each other. The first conductive line C1 is electrically coupled to the gate strips 125A and 125B through respective first conductive vias VG.

In some embodiments, the first metal layer patterns M0 further include second conductive lines C2 superimposed over the conductive strips 160A, 160B, 165A, 165B, 170A and 170B. The second conductive lines C2 extend along the Y direction, and hence lengthwise directions of the conductive strips 160A, 160B, 165A, 165B, 170A and 170B are substantially parallel to lengthwise directions of the second conductive lines C2. The orientations of the conductive strips 160A, 160B, 165A, 165B, 170A and 170B and the second conductive lines C2 are substantially the same, and the conductive strips 160A, 160B, 165A, 165B, 170A, and 170B are underlying the second conductive lines C2. This arrangement allows large overlapping area between the conductive strips 160A, 160B, 165A, 165B, 170A, and 170B and the second conductive lines C2. The second conductive vias VD that serve to electrically connect the conductive strips 160A, 160B, 165A, 170A and 170B and the second conductive lines C2 are able to be positioned along this overlapping area for electrical connection. For example, the second conductive line C2 is disposed over the conductive strip 160A, and the second conductive via VD may be disposed on any place, along the Y direction, where the conductive strip 160A and the second conductive line C2 overlap one another. The positions of the second conductive vias VD can be relatively arbitrary because the conductive strips 160A, 160B, 165A, 165B, 170A and 170B and the second conductive lines C2 are aligned along the same direction (e.g., Y direction). Explained in a different way, the second conductive vias VD have the entire second conductive lines C2 as the connection node.

Since the Y direction positions of the second conductive vias VD are flexible, the second conductive vias VD can be formed in positions not over the cut section 180 as shown in FIG. 8, and hence the cut section 180 can be formed as a long cut section (e.g. intersecting more than one hundred conductive strips) without considering positions of the second conductive vias VD. In other words, the substantially parallel arrangement of the second conductive lines C2 and the conductive strips 160A, 160B, 165A, 165B, 170A and 170B is beneficial in forming a long cut section, such that unwanted curving end surfaces of the conductive strips 160A, 160B, 165A, 165B, 170A and 170B can be prevented.

In some embodiments, the second conductive lines C2 are formed over the second conductive vias VD. The first conductive lines C2 are respectively coupled to the conductive strips 160A, 160B, 165A, 170A and 170B through the corresponding second conductive vias VD.

In some embodiments, the conductive vias VG and VD and first and second conductive lines C1 and C2 can be formed using a dual damascene process. For example, as illustrated in FIGS. 11 and 12, an interlayer dielectric (ILD) layer ILD0 is formed in between the gate strips, an isolation feature 195 is formed in between the conductive strips, an etch stop layer ESL1, an ILD layer ILD1, an etch stop layer ESL2 and another ILD layer ILD2 can be formed over the substrate 10, and one or more patterning processes are carried out to form via openings in the ILD layer ILD1 and trench openings in the ILD layer ILD2, and a conductor (e.g. metal) are deposited into the via and trench openings, and then a planarization process such as chemical mechanical polishing (CMP) is carried out to planarize the conductor with a top surface of the ILD layer ILD2. As a result of the dual damascene process, the conductor in the via openings in the ILD layer ILD1 can serve as the conductive vias VG and VD, and the conductor in the trench openings in the ILD layer ILD2 can serve as the first metal layer patterns M0 including the conductive lines C1 and C2.

In some embodiments, the first conductive vias VG are formed along the second direction, i.e. X direction, in rows. As illustratively shown in FIG. 10, the first conductive vias VG corresponding to the gate strips 115A, 120A, 125A and 130A are formed along a row R1. For example, the first conductive vias VG corresponding to the gate strips 115A, 120A, 125A and 130A are arranged in a line. The first conductive vias VG corresponding to the gate strips 115B, 120B, 125B and 130B are formed along a row R2. For example, the first conductive vias VG corresponding to the gate strips 115B, 120B, 125B and 130B are arranged in a line.

In some embodiments, the second conductive vias VD are formed along the second direction, i.e. X direction, in rows. As illustratively shown in FIG. 10, the second conductive vias VD corresponding to the conductive strips 160A, 165A and 170A are formed along a row R3. For example, the second conductive vias VD corresponding to the conductive strips 160A, 165A and 170A are arranged in a line. The second conductive vias VD corresponding to the conductive strips 160B and 170B are formed along a row R4. For example, the second conductive vias VD corresponding to the conductive strips 160B, 165B and 170B are arranged in a line.

As described above, since the gate strips 115, 120, 125 and 130 are patterned using a long cut line (e.g. intersecting more than one hundred gate strips), the resulting gate strips 115A, 115B, 120A, 120B, 125A, 125B, 130A, and 130B may have end surfaces free from a curved or rounded profile. As a result, the spacing between the gate strips and the active regions, e.g. the spacing D1 between the end surface of the gate strip 130A close to the upper side boundary and the active region 105 and the spacing D2 between the end surface of the gate strip 130 facing the gate strip 130B and the active region 105 in FIG. 10, can be kept larger. A better isolation efficiency of the spacing is obtained.

Moreover, due to the regular arrangement of the first conductive vias VG and the second conductive vias VD, the spacing D3 between one of the first conductive vias VG and one of the neighboring second conductive vias VD can be kept larger. A larger process window can also be obtained.

As illustratively shown in FIG. 10, a first pitch between two neighboring gate strips, e.g. the gate strips 120A and 125A, is CPP. A second pitch between two neighboring first metal layer patterns M0 is MP0.

In some embodiments, the first pitch CPP is substantially two times of the second pitch MP0. The spacing D3 between one of the first conductive vias VG and one of the neighboring second conductive vias VD ranges from 0 to CPP. Further, the spacing D4 between two of the closest first conductive vias VG ranges from CPP to 3× CPP, which is larger than the spacing D3.

Figure 13:
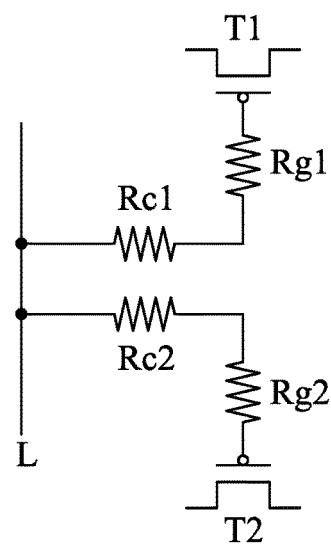
FIG. 13 is an exemplary a circuit diagram of an equivalent circuit of a part of the cell in FIG. 10, in accordance with various embodiments of the present disclosure.

FIG. 13 is an exemplary a circuit diagram of an equivalent circuit 200 of a part of the cell 100 in FIG. 10, in accordance with various embodiments of the present disclosure.

As illustratively shown in FIG. 13, the equivalent circuit 200 includes a pair of resistors Rc1 and Rc2, a pair of resistors Rg1 and Rg2, a pair of transistors T1 and T2 that correspond to the gate strips 120A and 120B and a signal line L.

The signal line L is equivalent to the first metal layer pattern M0 formed on the gate strips 120A and 120B. The resistors Rc1 and Rc2 are equivalent resistors formed by the two first conductive vias VG. The resistors Rg1 and Rg2 are equivalent resistors formed by the gate strips 120A and 120B.

The resistor Rc1 and the resistor Rg1 are electrically coupled in series to have a resistance Rb1 equivalent to the sum of the resistances of the resistor Rc1 and the resistor Rg1. The resistor Rc2 and the resistor Rg2 are electrically coupled in series to have a resistance Rb2 equivalent to the sum of the resistances of the resistor Rc2 and the resistor Rg2.

In some embodiments, the signal line L is configured for transmitting an input signal (not illustrated) from an external circuit to the pair of transistors T1 and T2. As a result, relative to the signal line L, the input resistances for the two transistors T1 and T2 are Rb1 and Rb2 respectively.

In some approaches, the gates of the transistors are formed by a single gate strip that is electrically coupled to the signal line through a single interconnection plug. Since the total transmission distance from the signal line to the two transistors is long, the input resistance is high.

Compared to such approaches, since the gate strip that forms the gates of the transistors T1 and T2 is cut to become two gate strips 120A and 120B and the two first conductive vias VG are correspondingly formed thereon, the total transmission distance from the signal line to the two transistors T1 and T2 is much shorter. The input resistance is reduced to result in a better device performance.

Figure 15:
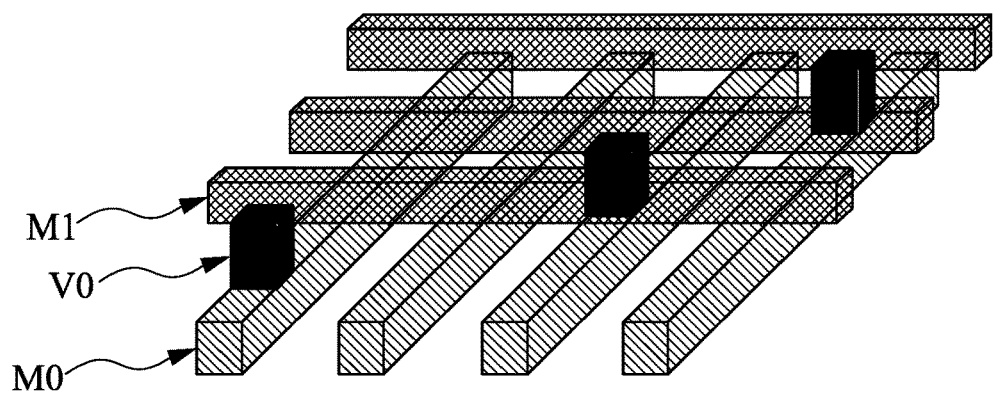
FIG. 15 is an exemplary perspective view of the cell in FIG. 14 in accordance with various embodiments of the present disclosure.

FIG. 14 is an exemplary plan view of the cell 100 at an intermediate stage during fabrication in accordance with some embodiments of the present disclosure. FIG. 15 is an exemplary perspective view of the cell in FIG. 14 in accordance with various embodiments of the present disclosure. For simplicity, the perspective view illustrates a portion of the elements in the cell 100 without showing each element. As illustrated in FIG. 14 and FIG. 15, third conductive vias V0 are formed over the first metal layer patterns M0, and second metal layer patterns M1 are formed over the third conductive vias V0. As illustratively shown in FIG. 14, the third conductive vias V0 are illustrated as black patterns each with a white cross, in which in FIG. 15 the third conductive vias V0 are illustrated as black cubes. The third conductive vias V0 are formed on the first metal layer patterns M0 respectively.

The third conductive vias V0 allow electrical connection between the first metal layer patterns M0 and the second metal layer patterns M1. Various conductive materials used to form the third conductive vias V0 are within the contemplated scope of the present disclosure.

The second metal layer patterns M1 are illustrated as patterns filled with dots, in which the second metal layer patterns M1 are formed along the second direction, i.e. X direction. For example, the first metal patterns M0 and the second metal layer patterns M1 cross. As a result, the second metal layer patterns M1 and the first metal layer patterns M0 are arranged in a perpendicular manner to form a plurality of intersections. The third conductive vias V0 are formed at the intersections to be electrically coupled to the second metal layer patterns M1 and the first metal layer patterns M0. Formation of the third conductive vias V0 and the second metal layer patterns M1 includes, for example, a dual damascene process analogous to that of forming the first and second conductive vias VG and VD and the first metal layer patterns M0, as described above.

In some embodiments, the second metal layer patterns M1 include a pair of power rails VDD and VSS. As a result, the power rails VDD and VSS supply power to the first metal layer patterns M0 through the third conductive vias V0 and further to the corresponding gate strips and the conductive strips through the first and second conductive vias VG and VD as shown in FIG. 10.

Figure 16:
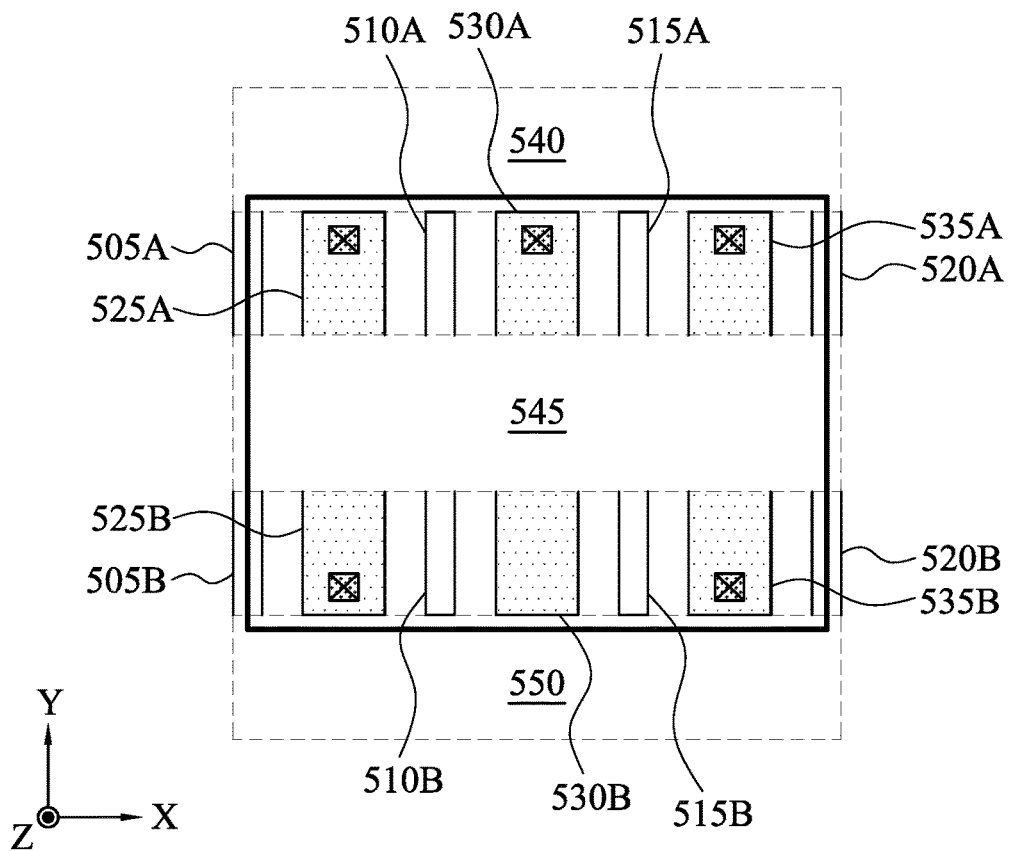
FIG. 16 is an exemplary plan view of a cell of a semiconductor device at an intermediate stage during fabrication in accordance with various embodiments of the present disclosure.

FIG. 16 is an exemplary plan view of a cell 500 of a semiconductor device at an intermediate stage during fabrication in accordance with various embodiments of the present disclosure. For illustration, four boundaries of the cell 500 are marked using solid lines. Within the four boundaries, the cell 500 includes gate strips 505A, 505B, 510A, 510B, 515A, 515B, 520A, and 520B, conductive strips 525A, 525B, 530A, 530B, 535A and 535B, and cut sections 540, 545 and 550.

The gate strips 505A, 505B, 510A, 510B, 515A, 515B, 520A, and 520B are spaced apart and extend along a first direction. In some embodiments, the first direction is Y direction. Similarly, the conductive strips 525A, 525B, 530A, 530B, 535A and 535B and extend along the first direction. The gate strips and the conductive strips are arranged in an alternating manner. The cut sections 540 and 550 are respectively formed on boundaries of the cell 500 that are opposite to each other along a second direction is substantially perpendicular to the first direction, in which the second direction is X direction.

For illustration, the cut sections 540 and 550 are disposed at an upper side boundary and a lower side boundary of the cell 500 respectively. The patterned gate strips 505A, 505B, 510A, 510B, 515A, 515B, 520A, and 520B are formed using an etch pattern that is formed by a cut line pattern corresponding to the cut section 545. The patterned conductive strips 525A, 525B, 530A, 530B, 535A and 535B are formed using an etch pattern that is formed by a cut line pattern corresponding to the cut section 545 as well. Since the patterned gate strips and the patterned conductive strips are formed using the same etch pattern that is formed by the same cut line pattern, end surfaces of the gate strips 505A, 510A, 515A and 520A and conductive strips 525A, 530A and 535A respectively facing the gate strips 505B, 510B, 515B and 520B and conductive strips 525B, 530B and 535B may be aligned in a substantially straight line (e.g. a line extending in X direction), if the cut line pattern is long enough (e.g. intersecting more than one hundred gate strips). Similarly, end surfaces of the gate strips 505B, 510B, 515B and 520B and conductive strips 525B, 530B and 535B respectively facing the gate strips 505A, 510A, 515A and 520A and conductive strips 525A, 530A and 535A may be aligned in a substantially straight line (e.g. a line extending in X direction).

Figure 17:
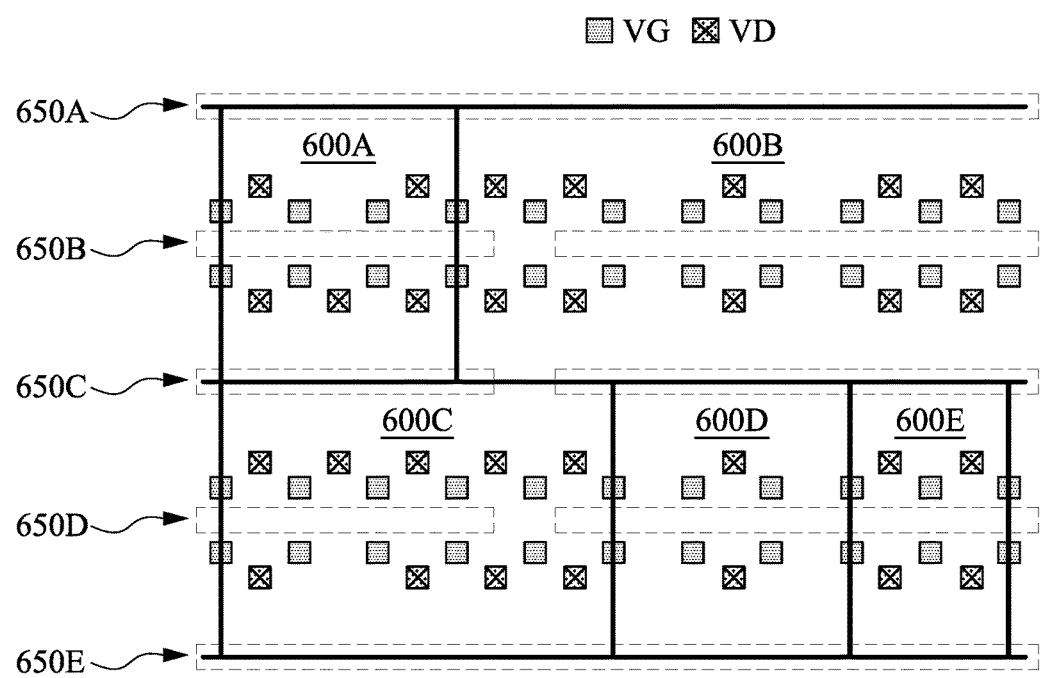
FIG. 17 is an exemplary plan view of a plurality of cells in accordance with various embodiments of the present disclosure.

FIG. 17 is an exemplary plan view of a plurality of cells 600A-600E in accordance with various embodiments of the present disclosure. For illustration, the boundaries of the cells 600A-600E are marked using solid lines. Within each cells 600A-600E, the first conductive vias VG, the second conductive vias VD and the cut sections 605A-605E are illustrated, and other elements are not illustrated.

In some embodiments, the second conductive vias VD in the neighboring cells 600A and 600B are aligned to each other, and the first conductive vias VG in the neighboring cells 600A and 600B are aligned to each other. Similarly, the second conductive vias VD in the neighboring cells 600C, 600D and 600E are aligned to each other, and the first conductive vias VG in the neighboring cells 600C, 600D and 600E are aligned to each other.

In some embodiments, the cut section 605A traverses the boundaries of the neighboring cells 600A and 600B. The cut section 605D traverses the boundaries of the neighboring cells 600C, 600D and 600E. In some embodiments, two cut sections 605B traverse the central region of the neighboring cells 600A and 600B. Two cut sections 605C traverse the boundaries of the neighboring cells 600A and 600B. Three cut sections 605D traverse the central region of the neighboring cells 600C, 600D and 600E.

The number of the conductive strips, the conductive vias and the metal patterns described above are given for illustrative purposes. Various numbers of the conductive strips, the conductive vias and the metal patterns are within the contemplated scope of the present disclosure.

The range of the distance between each two of the elements described above are given for illustrative purposes. Various ranges of the distance between each two of the elements are within the contemplated scope of the present disclosure.

In some embodiments, a semiconductor device includes at least one first gate strip, at least one second gate strip, at least one first conductive line and at least one first conductive via. An end surface of the at least one first gate strip and an end surface of the at least one second gate strip are opposite each other. The at least one first conductive line is over the at least one first gate strip and the at least one second gate strip and across the end surface of the at least one first gate strip and the end surface of the at least one second gate strip. The at least one first conductive via connects the at least one first conductive line and the at least one first gate strip.

In some embodiments, a semiconductor device includes at least one active region, at least one conductive strip, at least one first conductive line and at least one first conductive via. The at least one active region includes source and drain regions. The at least one conductive strip crosses one of the source and drain regions of the at least one active region. The at least one first conductive line is over and extends substantially along a lengthwise direction of the at least one first conductive strip. The at least one first conductive via connects the at least one first conductive line and the at least one first conductive strip.

In some embodiments, a method of manufacturing a semiconductor device includes forming at least one first active region and at least one second active region, forming at least one first gate strip and at least one second gate strip respectively crossing the at least one first active region and the at least one second active region, wherein an end surface of the at least one first gate strip and an end surface of the at least one second gate strip are opposite each other, forming at least one first conductive via and at least one second conductive via respectively over the at least one first gate strip and the at least one second gate strip, and forming at least one first conductive line over the at least one first conductive via and the at least one second conductive via, wherein the at least one first conductive line extends substantially along a lengthwise direction of the at least one first gate strip.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
    a plurality of first gate strips, wherein end surfaces of the plurality of the first gate strips are aligned in a substantially straight line;
    at least one second gate strip, wherein the end surface of a first gate strip of the plurality of the first gate strips and an end surface of the at least one second gate strip are opposite each other;
    at least one first conductive line over the first gate strip and the at least one second gate strip and across the end surface of the first gate strip and the end surface of the at least one second gate strip; and
    at least one first conductive via connecting the at least one first conductive line and the first gate strip.

2. The semiconductor device of claim 1, further comprising:
    at least one second conductive via connecting the at least one first conductive line and the at least one second gate strip.

3. The semiconductor device of claim 1, wherein a lengthwise direction of the at least one first conductive line is substantially parallel with a lengthwise direction of the first gate strip.

4. The semiconductor device of claim 3, wherein a lengthwise direction of the at least one first conductive line is substantially parallel with a lengthwise direction of the at least one second gate strip.

5. The semiconductor device of claim 1, further comprising:
at least one second conductive line over the at least one first conductive line, wherein the at least one second conductive line and the at least one first conductive line cross.

6. The semiconductor device of claim 5, further comprising:
at least one third conductive via connecting the at least one first conductive line and the at least one second conductive line.

7. The semiconductor device of claim 1, wherein the end surfaces of a plurality of the second gate strips are aligned in a substantially straight line.

8. The semiconductor device of claim 1, wherein a plurality of the first conductive vias are arranged in a line.

9. The semiconductor device of claim 1, wherein the first conductive line superimposes over the first gate strip.

10. The semiconductor device of claim 8, wherein the first conductive line superimposes over the at least one second gate strip.

11. The semiconductor device of claim 1, further comprising:
an active region including a plurality of source/drain regions; and
a plurality of conductive strips, each of which crosses a respective one of the source/drain regions, wherein the plurality of the conductive strips have end surfaces aligned in a substantially straight line.

12. A semiconductor device, comprising:
at least one active region comprising source and drain regions;
a plurality of conductive strips, each of which crosses a respective one of the source and drain regions of the at least one active region, wherein the plurality of the conductive strips have end surfaces aligned in a substantially straight line;
at least one first conductive line over and extending substantially along a lengthwise direction of a first conductive strip of the plurality of the conductive strips; and
at least one first conductive via connecting the at least one first conductive line and the first conductive strip.

13. The semiconductor device of claim 12, wherein a plurality of the first conductive vias are arranged in a line.

14. The semiconductor device of claim 12, further comprising:
at least one second conductive line over the at least one first conductive line, wherein the at least one second conductive line and the at least one first conductive line cross.

15. The semiconductor device of claim 14, further comprising:
at least one second conductive via connecting the at least one first conductive line and the at least one second conductive line.

16. The semiconductor device of claim 12, wherein the at least one first conductive line superimposes over at least one of the plurality of the conductive strips.

17. The semiconductor device of claim 12, further comprising a plurality of gate strips, wherein end surfaces of the plurality of the gate strips are aligned in a substantially straight line.

18. A method of manufacturing a semiconductor device, the method comprising:
forming at least one first active region and at least one second active region;
forming at least one first gate strip and at least one second gate strip respectively crossing the at least one first active region and the at least one second active region, wherein an end surface of the at least one first gate strip and an end surface of the at least one second gate strip are opposite each other;
forming at least one first conductive via and at least one second conductive via respectively over the at least one first gate strip and the at least one second gate strip; and
forming at least one first conductive line over the at least one first conductive via and the at least one second conductive via, wherein the at least one first conductive line extends substantially along a lengthwise direction of the at least one first gate strip.

19. The method of claim 18, further comprising:
forming at least one first conductive strip and at least one second conductive strip respectively crossing the at least one first active region and the at least one second active region, wherein an end surface of the at least one first conductive strip and an end surface of the at least one second conductive strip are opposite each other.

20. The method of claim 19, further comprising:
forming at least one third conductive via and at least one fourth conductive via respectively over the at least one first conductive strip and the at least one second conductive strip; and
forming at least one third conductive line and at least one fourth conductive line respectively over the at least one third conductive via and the at least one fourth conductive via, wherein the at least one third conductive line extends substantially along a lengthwise direction of the at least one first conductive strip, and the at least one fourth conductive line extends substantially along a lengthwise direction of the at least one second conductive strip.

* * * * *